(12) United States Patent
Kishi

(10) Patent No.: US 7,282,455 B2
(45) Date of Patent: Oct. 16, 2007

(54) METHOD OF PRODUCING A DIFFRACTION GRATING

(75) Inventor: Takeshi Kishi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 123 days.

(21) Appl. No.: 11/296,853

(22) Filed: Dec. 8, 2005

(65) Prior Publication Data

US 2006/0134815 A1    Jun. 22, 2006

(30) Foreign Application Priority Data

Dec. 10, 2004    (JP)    ............................ P2004-358653

(51) Int. Cl.
*H01L 21/461*    (2006.01)
(52) U.S. Cl. ...................... 438/735; 438/737; 438/738; 257/E21.22; 257/E21.232
(58) Field of Classification Search ................ 438/735, 438/737, 738; 257/E21.22, E21.232
See application file for complete search history.

(56) References Cited

U.S. PATENT DOCUMENTS 5,221,429 A * 6/1993 Makuta ...................... 216/24

5,872,022 A * 2/1999 Motoda et al. ............... 438/39

FOREIGN PATENT DOCUMENTS

| EP | 0439324 A2 | * | 7/1991 |
| JP | 61138202 A | * | 6/1986 |
| JP | 05-142406 | | 6/1993 |
| JP | 06148413 A | * | 5/1994 |
| JP | 08029605 A | * | 2/1996 |
| JP | 10303175 A | * | 11/1998 |

* cited by examiner

*Primary Examiner*—Trung Dang
(74) *Attorney, Agent, or Firm*—Smith, Gambrell & Russell, LLP

(57) ABSTRACT

In an embodiment, a method of producing a diffraction grating comprises steps of: forming, on a man surface of a first member, a first mask having a plurality of resist patterns arranged at a Bragg diffraction period; etching the first member by use of the first mask, thereby providing the first member with a diffraction grating; removing the first mask; forming, on the diffraction grating, a second member of which an etching rate is lower than that of the first member; forming a second mask on a first region in a surface of the second member, the first region and a second region in the surface being adjacent to each other; and etching the first member and the second member by use of the second mask.

16 Claims, 5 Drawing Sheets

METHOD OF PRODUCING A DIFFRACTION
GRATING

BACKGROUND OF THE INVENTION

1. Field of the Invention

The present invention relates to a method of producing a diffraction grating having a first portion and a second portions of which phases are inverted each other, in a first member.

2. Related Background of the Invention

In a semiconductor laser device of DFB (Distributed Feedback) type, a diffraction grating is formed between semiconductor layers. The DFB semiconductor laser device can generate laser light with a wavelength according to a period of the diffraction grating. Phases of a first portion and a second portion in the diffraction grating is inverted each other, whereby the DFB semiconductor laser device can generate laser light with a single mode. In the patent document 1 which is Japanese Patent Application Laid-open No. Hei 5-142406, a method of producing a diffraction grating having a phase inverted portion described above is disclosed.

According to the method of producing a diffraction grating disclosed in the patent document 1, a diffraction grating is produced as follows. First, by forming a mask on a first region on a main surface of a first member, which is originally flat, and etching the first member, a difference in level is formed between the first region and a second region of the first member. Next, by applying a resist to the first region and the second region of the first member and performing exposure and development of the resist, masks which are arranged at constant period is formed. By etching the first member by use of the masks, depressions and projections arranged at a constant period is formed in these regions. Furthermore, a second member with lower etching rate than that of the first member is formed on the first region and the second region of the first member and then, etching is performed. Due to the etching, depressions and projections inverted with respect to the depressions and projections formed in the previous etching process are formed in the first region. In this way, it is possible to produce a diffraction grating having a first portion and a second portion of which phases are inverted each other, in a first member.

SUMMARY OF THE INVENTION

In the method of producing a diffraction grating disclosed in the patent document 1 described above, a resist is coated after forming the difference in level between the first region and the second region of the first member, and by performing exposure and development of the resist, masks arranged at a constant period is formed. Therefore, the thickness of the coated resist and the exposure conditions differ between the first region and the second region of the first member. Accordingly, the dimension and shape of a diffraction grating to be formed in each region are likely to differ from each other.

The present invention is developed in order to solve the above-mentioned problems and an object thereof is to provide a method capable of highly precisely forming a diffraction grating having a first portion and a second portions of which phases are inverted each other.

A method of producing a diffraction grating according to a first invention comprise (1) a first mask forming step of forming, on a main surface of a first member, a first mask having a plurality of resist patterns arranged at a Bragg diffraction period in a direction along the main surface; (2) a first etching step of etching the first member by use of the first mask formed in the first mask forming step, thereby providing the first member with a diffraction grating; (3) a first mask removing step of removing the first mask after the first etching step; (4) a second member forming step of forming a second member of which an etching rate is lower than that of the first member, on the diffraction grating after the first mask removing step; (5) a second mask forming step of forming a second mask on a first region in a surface of the second member, the first region and a second region in the surface being adjacent to each other in the direction; (6) a second etching step of etching the first member and the second member by use of the second mask formed in the second mask forming step; (7) a second mask removing step of removing the second mask after the second etching step; and (8) a second member removing step of removing the second member after the second mask removing step.

A method of forming a diffraction grating according to a second invention comprises: (1) the same first mask forming step as the above-mentioned step; (2) the same first etching step as the above-mentioned step; (3) the same first mask removing step as the above-mentioned step; (4) the same second member forming step as the above-mentioned step; (5) the same second mask forming step as the above-mentioned step; (6) a second member removing step of removing the second member under the second region after the second mask forming step; (7) a second mask removing step of removing the second mask after the second member removing step; and (8) a second etching step of etching the first member and the second member after the second mask removing step.

Here, the respective first member and the second member are preferable to be III-V group compound semiconductors lattice-matched to InP, respectively, and the etching rate of the first member is higher than the etching rate of the second member. For example, the first member is InP and in this case, the second member is $In_xGa_{1-x}As_yP_{1-y}$ (0<x<1, 0<y<1), InGaAs, $Al_xGa_yIn_{1-x-y}As$ (0<x<1, 0<y<1, x+y<1), or AlInAs. Alternatively, for example, the first member is $In_{x1}Ga_{1-x1}As_{y1}P_{1-y1}$ (0<x1<1, 0<y1<1, x1>x2) and in this case, the second member is $In_{x2}Ga_{1-x2}As_{y2}P_{1-y2}$ (0<x2<1, 0<y2<1, x1>x2), InGaAs, $Al_xGa_yIn_{1-x-y}As$ (0<x<1, 0<y<1, x+y<1), or AlInAs Alternatively, for example, the first member is InGaAs and in this case, the second member is $Al_xGa_yIn_{1-x-y}As$ (0<x<1, 0<y<1, x+y<1), or AlInAs. Alternatively, for example, the first member is $Al_{x1}Ga_{y1}In_{1-x1-y1}As$ (0<x1<1, 0<y1<1, x1+y1<1, x1<x2) and in this case, the second member is $Al_{x2}Ga_{y2}In_{1-x2-y2}As$ (0<x2<1, 0<y2<1, x2+y2<1, x1<x2), or AlInAs.

DESCRIPTION OF THE PREFERRED EMBODIMENTS

Preferred embodiments according to the present invention are explained in detail below with reference to accompanying drawings. The same elements in drawings are assigned the same symbols in explanation and duplicated explanation is omitted.

First Embodiment

Figure 1:
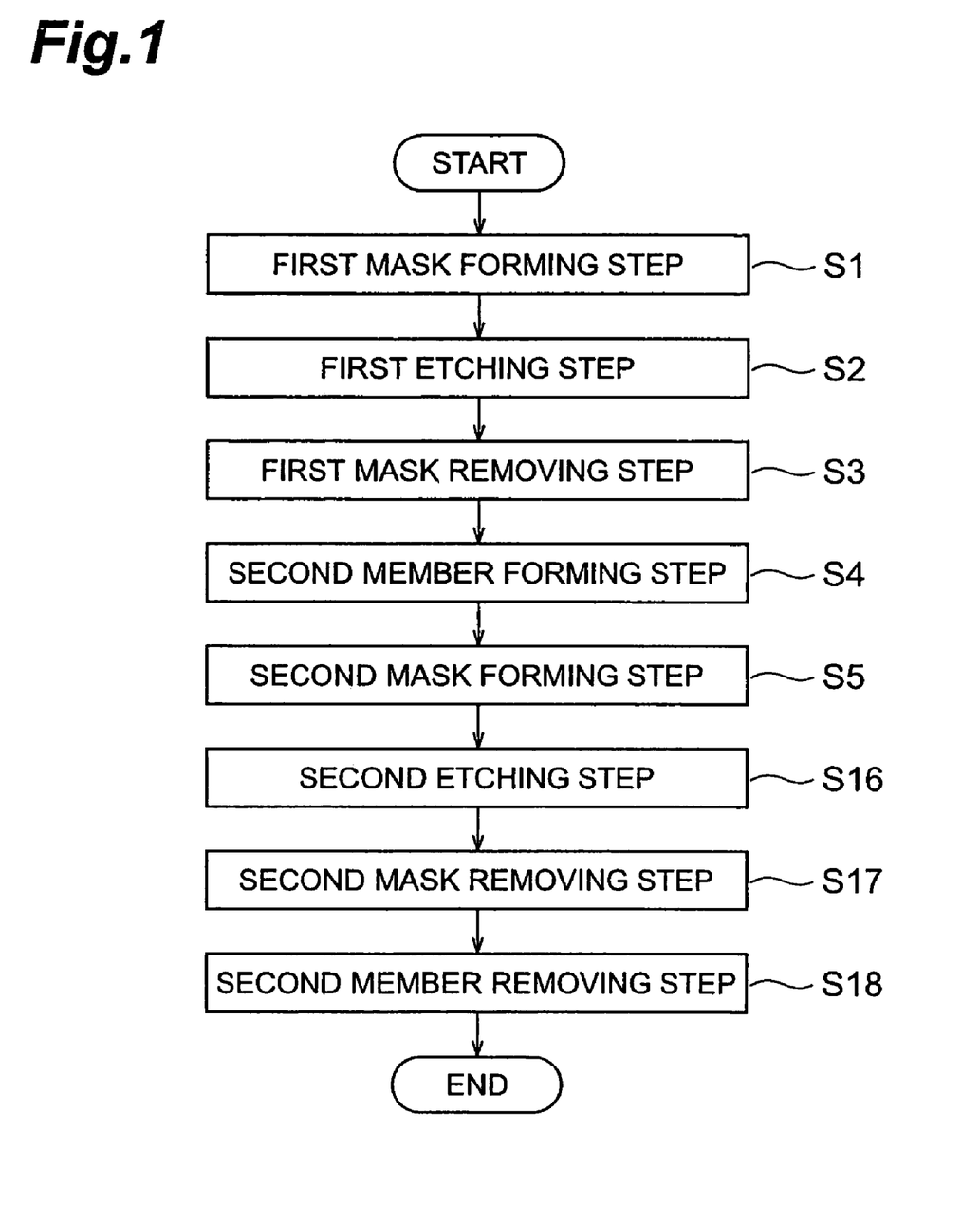
FIG. 1 is a flow chart of a method of producing a diffraction grating according to a first embodiment.
Figure 2:
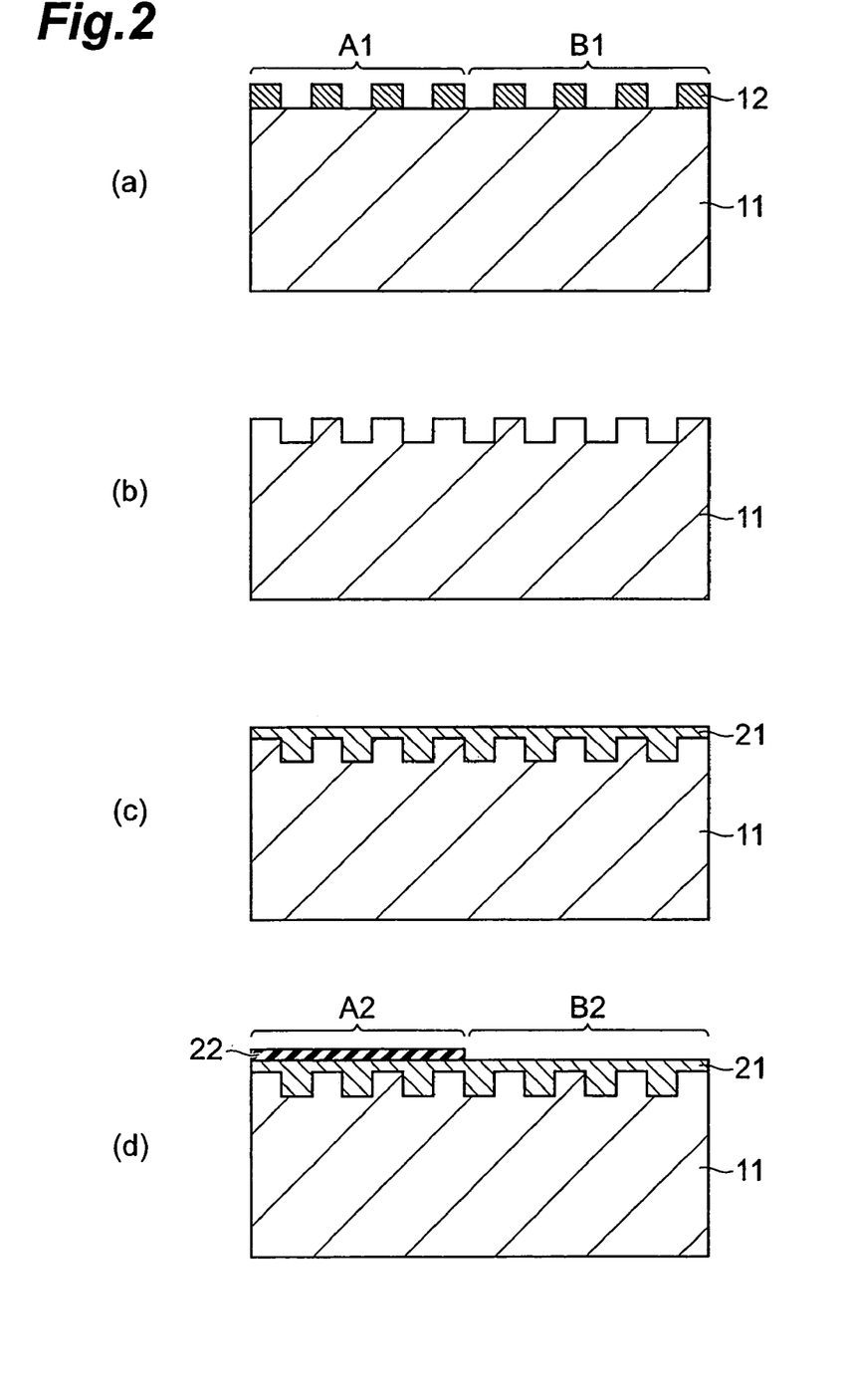
FIG. 2 shows section views for explaining a step of a method of producing a diffraction grating according to the first embodiment and a second embodiment.
Figure 3:
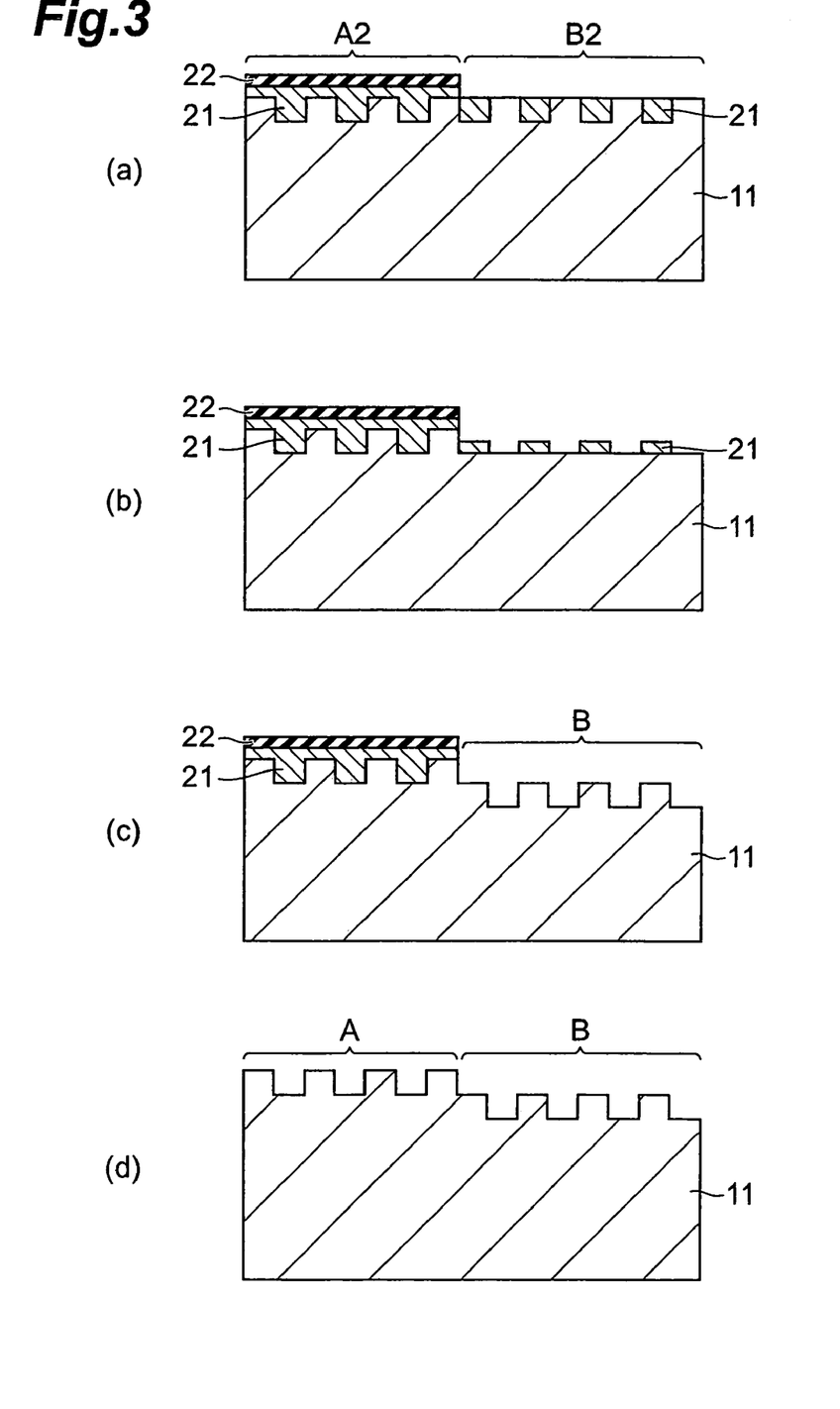
FIG. 3 shows section views for explaining a step of a method of producing a diffraction grating according to the first embodiment.

A first embodiment of a method of producing a diffraction grating according to the present invention is explained. FIG. 1 is a flow chart of the method of producing a diffraction grating according to the first embodiment. FIG. 2 and FIG. 3 show section views for explaining a process of the method of producing a diffraction grating according to the first embodiment.

A diffraction grating to be produced by this method is one formed in a first member 11 as shown in (d) of FIG. 3, and a phase of a diffraction grating of a first portion A and a phase of a diffraction grating of second portion B are inverted each other. The first member 11 is composed of a semiconductor material for example or any one of semiconductor layers included in a semiconductor laser device for example. The diffraction grating formed in the first member 11 has the first portion A and the second portion B. The first portion A is adjacent to the second portion B in a predetermined direction. Each of the first portion A and the second portion B includes depressions and projections which are arranged alternatively. The depressions and projections extend in a direction intersecting with the predetermined direction.

In order to produce such a diffraction grating, first, in a first mask forming step S1, the first member 11 having a main surface which is flat is prepared, and a first mask 12 is formed on the first region A1 and the second region B1 in the main surface of the first member 11, as shown in (a) of FIG. 2. The first region A1 is adjacent to the second region B1 in a direction along the main surface of the first member 11, which is the same direction as the predetermined direction. The first mask 12 has a plurality of resist patterns. Each of the resist patterns has a constant width, and extends in a direction parallel to the boundary line between the first region A1 and the second region B1. The resist patterns are arranged at a constant interval. That is, the resist patterns are arranged at a Bragg diffraction period in the direction along the main surface of the first member 11. Such first mask 12 can be formed by uniformly coating a resist onto the main surface of the first member 11 and performing processing of two-beam interference exposure and development to the resist. The period of the first mask 12 is, for example, about 200 nm.

In a first etching step S2 following the first mask forming step S1, an etching of the first member 11 is performed by use of the first mask 12 formed in the first mask forming step S1, to provide a diffraction grating with the first member 11. In the first etching step S2, either a wet etching or a dry etching may be used. As etchant, in the case of a wet etching, HBr base etching solution is used and in the case of a dry etching, CH$_4$ base gas is used. The depth of the diffraction grating formed in the first etching step S2 is, for example, about 20 nm. Then, in a first mask removing step S3 following the first etching step S2, the first mask 12 are removed, as shown in (b) of FIG. 2.

In a second member forming step S4 following the first mask removing step S3, a second member 21 is formed on the diffraction grating formed in the first etching step S2, as shown in (c) of FIG. 2. The second member 21 has lower etching rate at the time of a later second etching step S16 than that of the first member 11. The second member 21 can be formed by, for example, OMVPE (Organo-Metallic Vapor Phase Epitaxy). The thickness of the second member 21 is preferably such that the depression of the first member 11 is filled and a flat surface is provided by the second member 21. For example, the thickness of the second member 21 is preferably 50 nm or more.

In a second mask forming step S5 following the second member forming step S4, a second mask 22 is formed on a first region A2 in a surface of the second member 21, as shown in (d) of FIG. 2. The first region A2 and a second region B2 in a surface of the second member 21 are adjacent to each other in the predetermined direction. The second mask 22 is composed of, for example, a silicon nitride (SiN) film and can be formed by photolithography using a resist.

In the second etching step S16 following the second mask forming step S5, etching is performed by use of the second mask 22 formed in the second mask forming step S5, as shown in (a) to (c) of FIG. 3. Due to this, a diffraction grating, which is the inverted version of the diffraction grating formed in the first etching step S2, is formed in a portion of the first member 11, as shown in (c) of FIG. 3. That is, in the second etching step S16, the diffraction grating of the second portion B is produced.

In the second etching step S16, the second member 21 is uniformly etched at a portion which is not covered with the second mask 22, and a flat surface is formed on which the first member 11 and the second member 21 appear by turns, as shown in (a) of FIG. 3. When the etching is performed further, the first member 11 is etched faster than the second member 21 in the portion which is not covered with the second mask 22 as shown in (b) of FIG. 3, and soon the second member 21 is etched out and the diffraction grating of the second portion B is formed in the first member 11 as shown in (c) of FIG. 3. The diffraction grating formed in the first member 11 in the second etching step S16 is the inverted version of the diffraction grating formed on the second region B1 of the first member 11 in the previous first etching step S2.

In a second mask removing step S17 following the second etching step S16, the second mask 22 on the first region A2 is removed. Then, in a second member removing step S18 following the second mask removing step S17, the second member 21 is removed as shown in (d) of FIG. 3. The removal of the second mask 22 and the second member 21 is performed by selective etching, respectively.

Preferred examples of the first member 11 and the second member 21 are as follows. Preferably, for example, the first member 11 is composed of InP and the second member 21 is composed of GaInAs, and dry etching is performed using CH$_4$ base gas as an etchant in the second etching step S16. In this case, the etching rate of the first member 11 is 50 nm/min, the etching rate of the second member 21 is 25 mm/min, and the selectivity ratio is 2:1. Therefore, it is possible to form the diffraction grating of the second portion B of which a phase is inverted with respect to a phase of the diffraction grating of the first portion A so that a depth of the diffraction grating of the second portion B substantially becomes the same as that of the diffraction grating of the first portion A, at the time of the second etching step S16.

Further, preferably, the first member 11 is composed of InP and the second member 21 is composed of AlInAs, and dry etching is performed using CH$_4$ base gas as an etchant in the second etching step S16. In this case, the etching rate of the first member 11 is 50 nm/min, the etching rate of the second member 21 is 8 nm/min, and the selectivity ratio is 6:1, therefore, it is possible to increase the depth of the diffraction grating of the second portion B by a factor of five as well as inverting the phase of the diffraction grating, at the time of the second etching step S16.

It is also possible to appropriately set the selectivity ratio (n: 1) at the time of the second etching step S16 according to the respective compositions of the first member 11 and the second member 21 and the etchant, and to increase the depth of the diffraction grating of the second portion B by a factor of (n−1) as well as inverting a phase of the diffraction grating of the second portion B, at the time of the second etching step S16. For example, when the first member 11 is InP, and if the second member 21 is GaInAsP, the above n value is 1 to 2 and if the second member 21 is AlGaInGAs, the above n value is 2 to 6, thus the n value differs according to the composition of the second member.

As described above, according to the method of producing a diffraction grating of the present embodiment, it is possible to form the first mask 12 by coating a resist onto the flat main surface of the first member 11 in the first mask forming step S1 without forming a difference in level in the first member 11, as shown in (a) of FIG. 2, and it is also possible to form the second mask 22 on the flat surface of the second member 21 in the second mask forming step S5 as shown in (d) of FIG. 2. Due to this, on the first region A1 and the second region B1 of the first member 11, the thickness of the coated resist is substantially the same and the exposure conditions are also substantially the same, therefore, it is possible to easily set the dimensions and shape of a diffraction grating to be formed on each region as desired. Therefore, by the method of producing a diffraction grating according to the present embodiment, it is possible to produce with high precision a diffraction grating having the first portion A and the second portion B of which phases are inverted each other. Further, the second member 21 may be a member of which an etching rate at the time of the second etching step S16 is lower than that of the first member 11 and therefore, it may be metal, insulator, dielectric, etc., besides semiconductor.

Further, at the time of the second etching step S16, in the portion which is not covered with the second mask 22, only the second member 21 is etched at first as shown in (a) of FIG. 3, and when etching proceeds further, both of the second member 21 and the first member 11 are etched as shown in (b) of FIG. 3 and then, only the first member 11 is etched as shown in (c) of FIG. 3. Therefore, it is possible to easily detect that the second member 21 has removed (that is, the second etching step S16 may be ended) based on the signal from a plasma monitor. Even if etching is further performed after the second member 21 has removed, the depth of the diffraction grating in the first member 11 remains unchanged, therefore, regarding this point also, it is possible to produce with high precision a diffraction grating having the first portion A and the second portion B of which phases are inverted each other.

Preferably, the method of producing a diffraction grating is used to manufacture a DFB semiconductor laser device of buried type. In other words, as described also in the patent document 1, in a DFB semiconductor laser device of buried type, for example, on an n-type InP substrate, an n-type InP clad layer, an n-type SCH layer, an active layer, a p-type SCH layer, a p-type InP clad layer, and a p-type InGaAs cap layer are stacked in this order and each layer is patterned into a stripe shape, and a p-type InP burying layer and an n-type InP burying layer are formed on both sides of the stripe. In a semiconductor laser device having such a structure, a diffraction grating formed at the boundary surface between the p-type. SCH layer and the p-type InP clad layer is preferably formed by the method of producing a diffraction grating according to the present embodiment. The diffraction grating formed on the p-type SCH layer by the method of producing a diffraction grating according to the present embodiment is formed highly precisely such that a phase of the first portion A and a phase of the second portion B are inverted each other, therefore, the semiconductor laser device can have an excellent single mode property and can reduce the threshold current.

Second Embodiment

Figure 4:
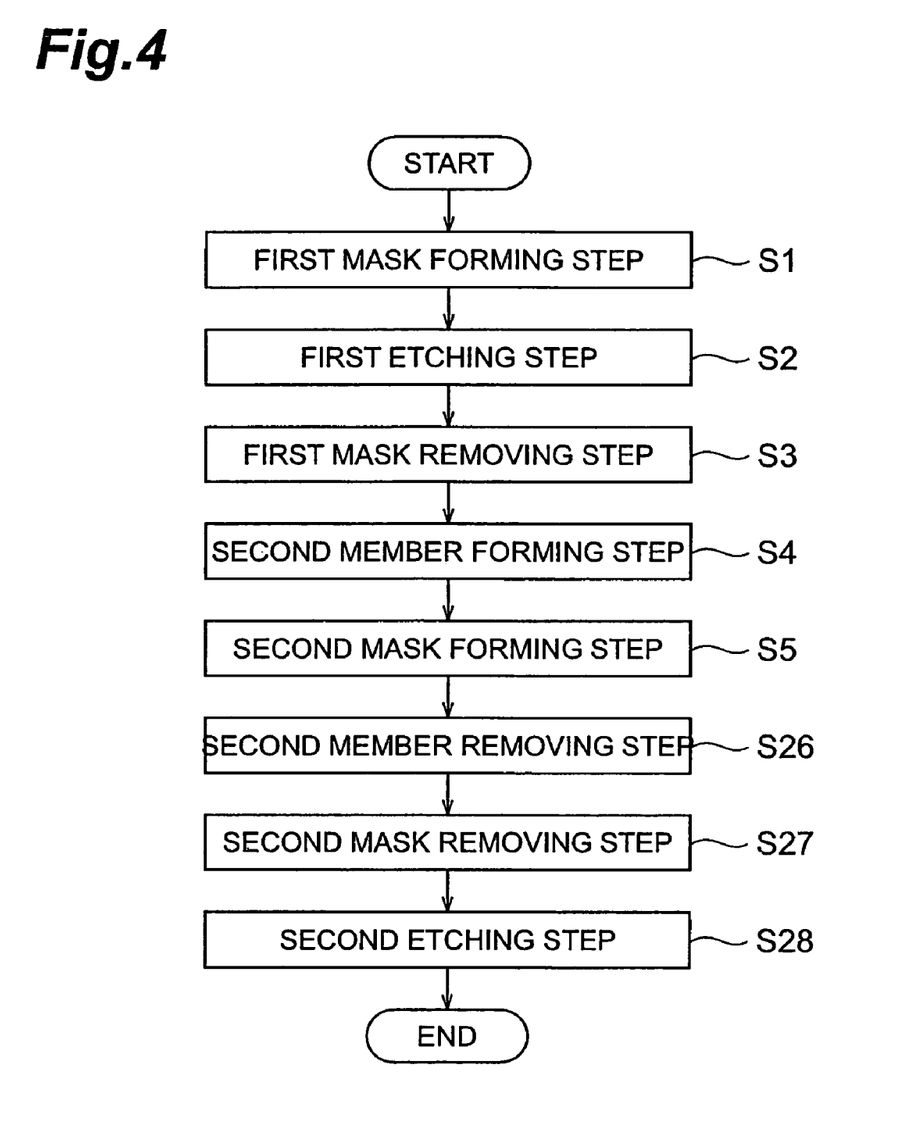
FIG. 4 is a flow chart of a method of producing a diffraction grating according to the second embodiment.
Figure 5:
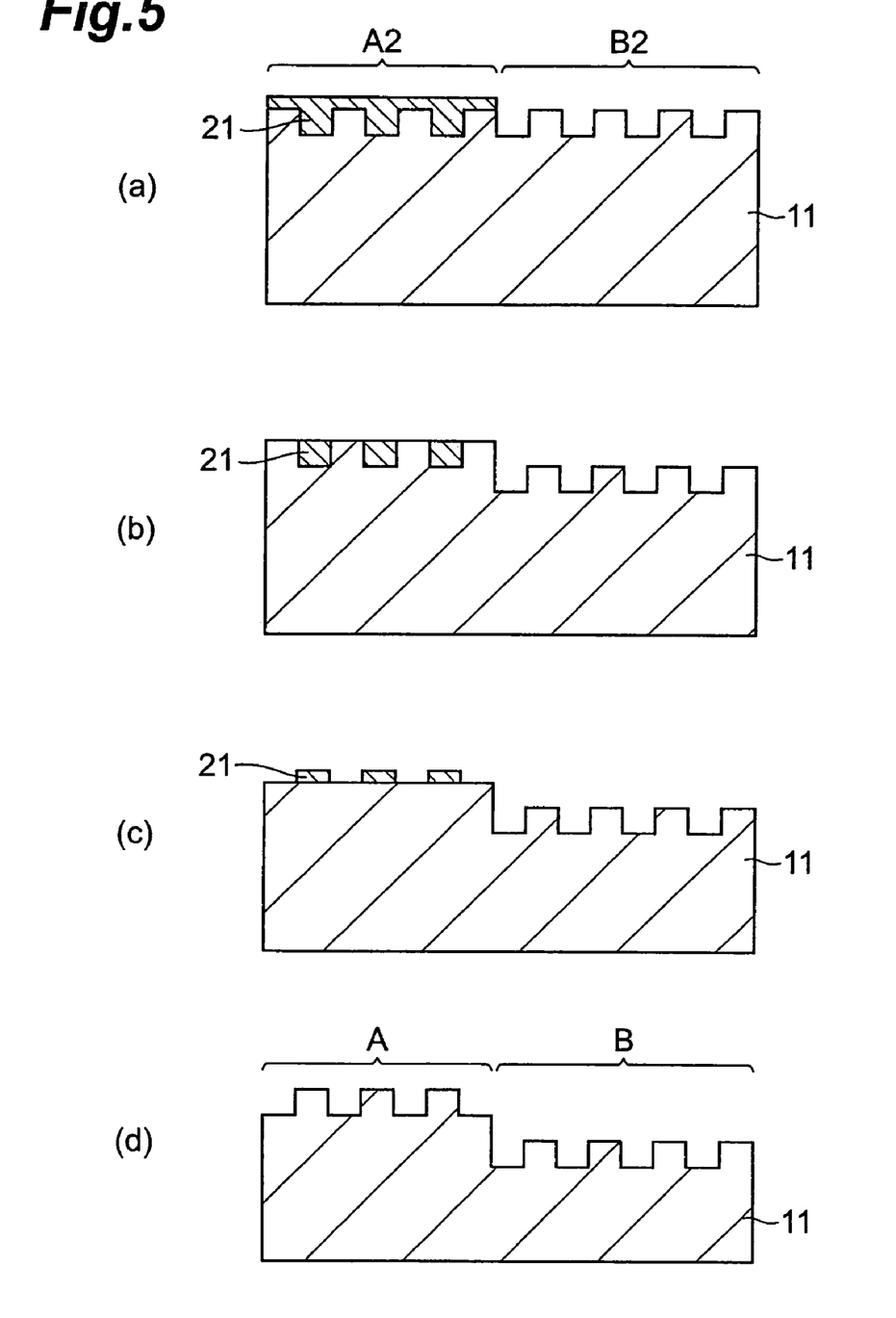
FIG. 5 shows section views for explaining a step of a method of producing a diffraction grating according to the second embodiment.

Next, a second embodiment of a method of producing a diffraction grating according to the present invention is explained below. FIG. 4 is a flow chart of the method of producing a diffraction grating according to the second embodiment. FIG. 2 and FIG. 5 shows section views for explaining a process of the method of producing a diffraction grating according to the second embodiment.

A first mask forming step S1, a first etching step S2, a first mask removing step S3, a second member forming step S4, and a second mask forming step S5 in the flow chart (FIG. 4) of the method of producing a diffraction grating according to the second embodiment are the same as those in the first embodiment, respectively. Therefore, FIG. 2 are common to the first embodiment and the second embodiment.

A diffraction grating to be formed by the method of producing a diffraction grating is one formed in the first member 11 as shown in (d) of FIG. 5, and a phase of the first portion A is inverted with respect to a phase of the second portion B. The first member 11 is composed of, for example, a semiconductor material or any one of semiconductor layers included in, for example, a semiconductor laser device. The diffraction grating formed in the first member 11 has the first portion A and the second portion B. The first portion A is adjacent to the second portion B in the predetermined direction. Each of the first portion A and the second portion B includes depressions and projections which are arranged alternatively. The depressions and projections extend in a direction intersecting with the predetermined direction.

In order to produce such a diffraction grating, as in the first embodiment, the first mask forming step S1 as shown in (a) of FIG. 2, the first etching step S2, the first mask removing step S3 as shown in (b) of FIG. 2, the second member forming step S4 as shown in (c) of FIG. 2, and the second mask forming step S5 as shown in (d) of FIG. 2 are performed in this order.

In a second member removing step S26 following the second mask forming step S5, the second member 21 under the second region B2 is removed, and further, in a second mask removing step S27 following this, the second mask 22 on the first region A2 is removed as shown in (a) of FIG. 5. The removal of the second member 21 under the second region B2 and the second mask 22 on the first region A2 is performed by selective etching, respectively.

In a second etching step S28 following the second mask removing step S27, etching is performed for both the first member 11 and the second member 21 as shown in (b) to (d) of FIG. 5. Due to this, a diffraction grating of the first portion A of which a phase is inverted with respect to the diffraction grating formed in the first etching step S2, is produced in the first member 11 as shown in (d) of FIG. 5(d).

In the second etching step S28, a depth of a diffraction grating of a portion which becomes the second portion B remains unchanged. On the other hand, in the other portion which becomes the first portion A, the second member 21 is uniformly etched at first and then, a flat surface is formed on which the first member 11 and the second member 21 appear alternately, as shown in (b) of FIG. 5. When the etching proceeds, the first member 11 is etched faster than the second member 21 in the other portion as shown in (c) of FIG. 5, and soon the second member 21 is removed, and the diffraction grating of the first portion A is formed in the first member 11 as shown in (d) of FIG. 5. The diffraction grating of the first portion A formed in the second etching step S28 is the inverted version of the diffraction grating formed in the first member 11 in the previous first etching step S2.

In the present embodiment also, preferably, the first member 11 is composed of InP and the second member 21 is composed of GaInAs, and dry etching is performed using $CH_4$ base gas as an etchant in the second etching step S28. Further, preferably, the first member 11 is composed of InP and the second member 21 is composed of AlInAs, and dry etching is performed using $CH_4$ base gas as an etchant in the second etching step S28. It is also possible to appropriately set the selectivity ratio (n: 1) at the time of the second etching step S28 according to the respective compositions of the first member 11 and the second member 21 and the etchant, and to increase the depth of the diffraction grating by a factor of (n−1) as well as inverting the phase of the diffraction grating at the time of the second etching step S28. In addition, as the etchant in the second etching step S28, the mixture of phosphoric acid, hydrogen peroxide, and $H_2O$ can be used.

By the method of producing a diffraction grating according to the present embodiment, it is also possible to obtain the same effects by the method of producing a diffraction grating according to the first embodiment. Further, the method of producing a diffraction grating is also preferably used to manufacture a DFB semiconductor laser device of buried type.

According to the method of producing a diffraction grating of the present invention, it is possible to highly precisely produce a diffraction grating having a first portion and a second portion of which phases are is inverted each other.

What is claimed is:

1. A method of producing a diffraction grating comprising:
    a first mask forming step of forming, on a main surface of a first member, a first mask having a plurality of resist patterns arranged at a Bragg diffraction period in a direction along the main surface;
    a first etching step of etching the first member by use of the first mask formed in the first mask forming step, thereby providing the first member with a diffraction grating;
    a first mask removing step of removing the first mask after the first etching step;
    a second member forming step of forming a second member of which an etching rate is lower than that of the first member, on the diffraction grating after the first mask removing step;
    a second mask forming step of forming a second mask on a first region in a surface of the second member, the first region and a second region in the surface being adjacent to each other in the direction;
    a second etching step of etching the first member and the second member by use of the second mask formed in the second mask forming step;
    a second mask removing step of removing the second mask after the second etching step; and
    a second member removing step of removing the second member after the second mask removing step.

2. A method of producing a diffraction grating comprising:
    a first mask forming step of forming, on a main surface of a first member, a first mask having a plurality of resist patterns arranged at a Bragg diffraction period in a direction along the main surface;
    a first etching step of etching the first member by use of the first mask formed in the first mask forming step, thereby providing the first member with a diffraction grating;
    a first mask removing step of removing the first mask after the first etching step;
    a second member forming step of forming a second member of which an etching rate is lower than that of the first member, on the diffraction grating after the first mask removing step;
    a second mask forming step of forming a second mask on a first region in the surface of the second member, the first region and a second region being adjacent to each other in the direction;
    a second member removing step of removing the second member under the second region after the second mask forming step;
    a second mask removing step of removing the second mask after the second member removing step; and
    a second etching step of etching the first member and the second member after the second mask removing step.

3. The method according to claim 1, wherein the first member and the second member are III-V group compound semiconductors substantially lattice-matched to InP respectively, the etching rate of the first member is higher than the etching rate of the second member, and a dry etching is performed in the second etching step.

4. The method according to claim 2, wherein the first member and the second member are III-V group compound semiconductors substantially lattice-matched to InP respectively, the etching rate of the first member is higher than the etching rate of the second member, and a dry etching is performed in the second etching step.

5. The method according to claim 1, wherein the first member is InP, and the second member is $In_xGa_{1-x}As_yP_{1-y}$ (0<x<1, 0<y<1), InGaAs, $Al_xGa_yIn_{1-x-y}As$ (0<x<1, 0<y<1, x+y<1), or AlInAs.

6. The method according to claim 5, wherein a dry etching is performed in the second etching step, and $CH_4$ base gas is used as etchant in the dry etching.

7. The method according to claim 2, wherein the first member is InP, and the second member is $In_xGa_{1-x}As_yP_{1-y}$ (0<x<1, 0<y<1), InGaAs, $Al_xGa_yIn_{1-x-y}As$ (0<x<1, 0y<1, x+y<1), or AlInAs.

8. The method according to claim 7, wherein a dry etching is performed in the second etching step, and $CH_4$ base gas is used as etchant in the dry etching.

9. The method according to claim 1, wherein the first member is $In_{x1}Ga_{1-x1}As_{y1}P_{1-y1}$ (0<x1<1, 0<y1<1, x1>x2), and the second member is $In_{x2}Ga_{1-x2}As_{y2}P_{1-y2}$ (0<x2<1, 0<y2<1, x1>x2), InGaAs, $Al_xGa_yIn_{1-x-y}As$ (0<x<1, 0<y<1, x+y<1), or AlInAs.

10. The method according to claim 2, wherein the first member is $In_{x1}Ga_{1-x1}As_{y1}P_{1-y1}$ (0<x1<1, 0<y1<1, x1>x2), and the second member is $In_{x2}Ga_{1-x2}As_{y2}P_{1-y2}$ (0<x2<1, 0<y2<1, x1>x2), InGaAs, $Al_xGa_yIn_{1-x-y}As$ (0<x<1, 0<y<1, x+y<1), or AlInAs.

11. The method according to claim 1, wherein the first member is InGaAs, and the second member is $Al_xGa_yIn_{1-x-y}As$ ($0<x<1$, $0<y<1$, $x+y<1$), or AlInAs.

12. The method according to claim 2, wherein the first member is InGaAs, and the second member is $Al_xGa_yIn_{1-x-y}As$ ($0<x<1$, $0<y<1$, $x+y<1$), or AlInAs.

13. The method according to claim 1, wherein the first member is $Al_{x1}Ga_{y1}In_{1-x1-y1}As$ ($0<x1<1$, $0<y1<1$, $x1+y1<1$, $x1<x2$, the second member is $Al_{x2}Ga_{y2}In_{1-x2-y2}As$ ($0<x2<1$, $0<y2<1$, $x2+y2<1$, $x1<x2$), or AlInAs.

14. The method according to claim 2, wherein the first member is $Al_{x1}Ga_{y1}In_{1-x1-y1}As$ ($0<x1<1$, $0<y1<1$, $x1+y1<1$, $x1<x2$), the second member is $Al_{x2}Ga_{y2}In_{1-x2-y2}As$ ($0<x2<1$, $0<y2<1$, $x2+y2<1$, $x1<x2$), or AlInAs.

15. The method according to claim 1, wherein a ratio of the etching ratio of the first member to the etching ratio of the second member is 1:1 to 1:6.

16. The method according to claim 2, wherein a ratio of the etching ratio of the first member to the etching ratio of the second member is 1:1 to 1:6.

* * * * *